(12) United States Patent
Dorn et al.

(10) Patent No.: US 11,309,860 B1
(45) Date of Patent: Apr. 19, 2022

(54) SINGLE LADDER DUPLEXER WITH IMPEDANCE GRADIENT

(71) Applicant: Apple Inc., Cupertino, CA (US)

(72) Inventors: Oliver Georg Dorn, Erlangen (DE); Joonhoi Hur, Sunnyvale, CA (US); Rastislav Vazny, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/067,017

(22) Filed: Oct. 9, 2020

(51) Int. Cl.
*H03H 7/38* (2006.01)
*H03F 3/24* (2006.01)
*H04B 1/44* (2006.01)

(52) U.S. Cl.
CPC ............... *H03H 7/38* (2013.01); *H03F 3/245* (2013.01); *H04B 1/44* (2013.01); *H03F 2200/171* (2013.01); *H03F 2200/294* (2013.01); *H03F 2200/451* (2013.01)

(58) Field of Classification Search
CPC ..... H03H 7/38; H03F 3/245; H03F 2200/171; H03F 2200/294; H03F 2200/451; H04B 1/44
USPC ...................................................... 455/77–83
See application file for complete search history.

(56) References Cited

U.S. PATENT DOCUMENTS

| 7,573,354 B2 | 8/2009 | Nishihara et al. | |
|---|---|---|---|
| 7,701,311 B2 | 4/2010 | Nakamura et al. | |
| 9,608,595 B1 | 3/2017 | Raihn et al. | |
| 10,110,194 B2 | 10/2018 | Mori | |
| 2007/0232241 A1* | 10/2007 | Carley | H04B 1/44 455/83 |
| 2017/0244376 A1* | 8/2017 | Morris | H03H 7/0115 |

OTHER PUBLICATIONS

Kumar, "A 2.5-GHz CMOS Full-Duplex Front-End for Asymmetric Data Networks", IEEE Transactions on Circuits and Systems-I: Regular Papers, vol. 65, No. 10, Oct. 2018.

* cited by examiner

*Primary Examiner* — Lee Nguyen
(74) *Attorney, Agent, or Firm* — Fletcher Yoder PC (57) ABSTRACT

Embodiments presented herein relate to isolating a receiver circuit of an electronic device from a transmission signal and from a noise signal at a frequency range of a received signal. To do so, an isolation circuit is disposed between the receiver circuit and a transmission circuit. The isolation circuit may include multiple variable impedance devices and one or more antennas. The impedances of the variable impedance devices and the one or more antennas may be balanced such that the receiver circuit is effectively removed from the transceiver circuitry and isolated from the transmission signal. The impedance of the variable impedance devices and the one or more antennas may also be configured to isolate the receiver circuit from a noise signal generated at the transmission circuit having a frequency in the range of the receive signal.

20 Claims, 9 Drawing Sheets

SINGLE LADDER DUPLEXER WITH IMPEDANCE GRADIENT

BACKGROUND

The present disclosure relates generally to wireless communication systems and more specifically to isolating wireless signals between transmitters and receivers in wireless communication devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In an electronic device, a transmitter and a receiver may each be coupled to an antenna to enable the electronic device to both transmit and receive wireless signals. Certain electronic devices may include isolation circuitry having an electrical balanced duplexer (EBD) that isolates the transmitter from received signals, and the receiver from transmission signals, thus reducing interference when communicating. In such electronic devices, an impedance tuner may be used to match the impedance of the antenna to increase effectiveness of this isolation. However, the transmission path for transmission signals sent from the transmitter may branch between the antenna and the impedance tuner. As a result, some of the power used to transmit a transmission signal through the antenna may be lost (e.g., referred to as insertion loss) when the transmission signal branches to the impedance tuner. Similarly, the reception path for received signals received from the antenna may branch between the receiver and the impedance tuner. As a result, some of the power in the received signal received at the receiver may be lost (e.g., insertion loss) when the received signal branches to the impedance tuner.

Further, the transmitter may include a power amplifier that amplifies a transmission signal so that the transmission signal may be provided to the one or more antennas with sufficient transmission power. However, the power amplifier may introduce noise in the receive frequency band to the transmission signals (e.g., due to non-linear characteristics and/or real-world imperfections of the power amplifier), which may interfere with received signals at the receiver.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

To reduce insertion loss while maintaining isolation of the transmitter and receiver of an electronic device, the embodiments disclosed herein include an isolation circuit disposed between and coupled to a transmitter circuit and a receiver circuit. The isolation circuit isolates the transmitter circuit from received signals and isolates the receiver circuit from transmission signals. The isolation circuit also isolates the receiver circuit from noise signals generated by the transmission circuit having a frequency of signals received by the receiver circuit. The isolation circuit may include variable impedance devices (e.g., one or more impedance gradients, one or more impedance tuners, etc.) that are frequency dependent. In some embodiments, the isolation circuit includes one or more antennas.

Specifically, at frequency ranges of the transmission signals, the impedances of the variable impedance devices and the one or more antennas operate in a balanced state from the standpoint of the transmitter circuit, isolating the receiver circuit from the transmission signals. That is, the impedances are configured to cause zero voltage and/or current across the receiver circuit, effectively removing the receiver circuit from the transceiver circuitry, thus directing the transmission signals generated by the transmitter circuitry away from the receiver circuit and to the one or more antennas. Further, the impedances of the variable impedance devices may be configured to direct received signals received at the one or more antennas to the receiver circuitry and away from the transmitter circuitry, thus isolating the transmitter circuit from the received signal.

Moreover, at a frequency range of the received signals, the impedances of the variable impedance devices and the one or more antennas operate in a balanced state from the standpoint of the transmitter circuit to direct signals of the frequency range of the received signals generated by the transmitter circuitry (e.g., noise signals) away from the receiver circuit. Further, the impedances of the variable impedance devices direct the signals of the frequency range of the received signals generated by the transmitter circuit away from the receiver circuit. Thus, the impedances of the variable impedance devices may be configured to isolate the receiver circuit both from the transmission signals and a noise signal generated by the transmitter circuit. The impedances of the variable impedance devices may be different at the frequency range of the transmission signals than at the frequency range of the received signals.

In one embodiment, an electronic device is presented which includes a transmit circuit configured to generate a transmission signal. The electronic device also includes a receive circuit configured to receive a receive signal. The electronic device also includes an isolation circuit including an antenna having a first impedance. The antenna is communicatively coupled to the transmit circuit via a transmit path and is communicatively coupled to the receive circuit via a receive path. The isolation circuit includes a first variable impedance device disposed in the transmit path and having a first variable impedance. The isolation circuit also includes a second variable impedance device disposed between the transmit circuit and the receive circuit and having a second variable impedance. The isolation circuit also includes a third variable impedance device coupled between the receive circuit and the second variable impedance device and having a third variable impedance. The first variable impedance device, the second variable impedance device, and the third variable impedance device are configured to isolate the receive circuit from the transmission signal and from a noise signal generated by the transmit circuit having a frequency of the receive signal when a ratio of the first variable impedance to the first impedance is equal to a ratio of the second variable impedance to the third variable impedance.

In another embodiment, an electronic device is presented which includes one or more antennas having a first impedance. The electronic device also includes transmitter circuitry configured to transmit a transmission signal via the one or more antennas. The electronic device also includes receiver circuitry configured to receive a receive signal via the one or more antennas. The electronic device also includes a first variable impedance device having a first variable impedance. The electronic device also includes a second variable impedance device having a second variable impedance. The transmitter circuitry, the first variable impedance device, and the second variable impedance device are communicatively coupled together via a first node. The electronic device also includes a third variable impedance device having a third variable impedance. The first variable impedance device, the receiver circuitry, and the third variable impedance device are communicatively coupled together via a second node. The second variable impedance device, the receiver circuitry, and the one or more antennas are coupled together via a third node.

In yet another embodiment, an electronic device is provided including means for transmitting a transmission signal. The electronic device also includes means for receiving a receive signal. The electronic device also includes means for isolating the receiving means from the transmission signal and a noise signal generated by the transmission means, the noise signal having a frequency of the receive signal. The isolating means includes a plurality of variable impedance devices for directing the transmission signal and the noise signal away from the receive circuit when in a balanced state. The electronic device also includes antenna means having a first impedance.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Use of the term "approximately," "near," "about", and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on).

Figure 1:
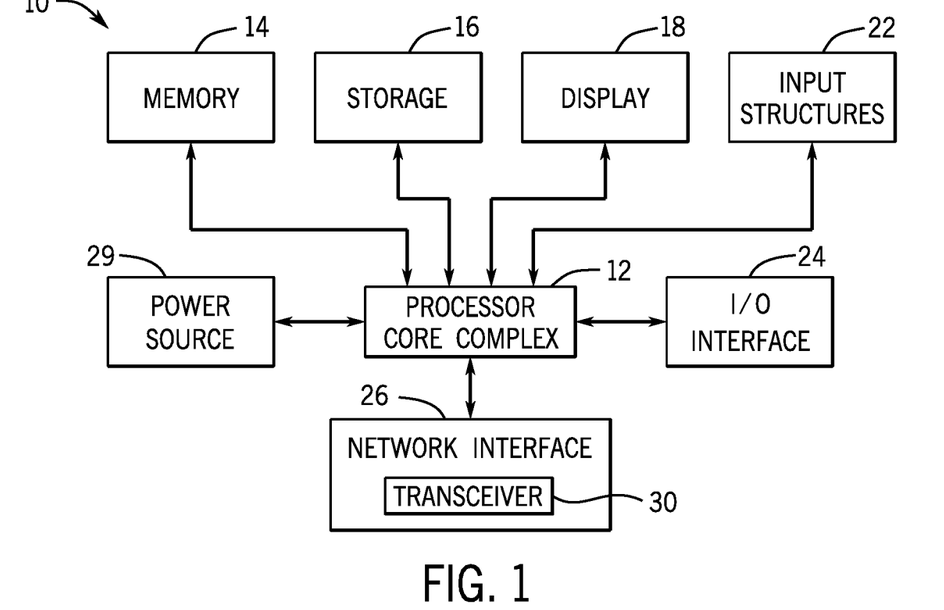
FIG. 1 is a block diagram of an electronic device, according to an embodiment of the present disclosure.

With the foregoing in mind, there are many suitable communication devices that may include and use the transceiver circuitry described herein. Turning first to FIG. 1, an electronic device 10 according to an embodiment of the present disclosure may include, among other things, a processor core complex 12 including one or more processor(s), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
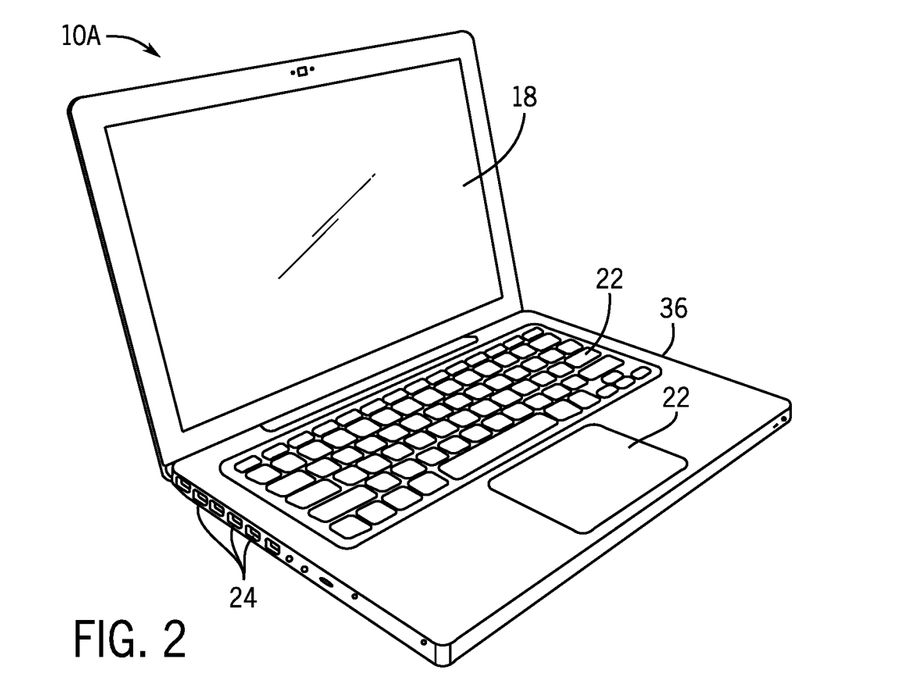
FIG. 2 is a perspective view of a notebook computer representing an embodiment of the electronic device of FIG. 1.
Figure 3:
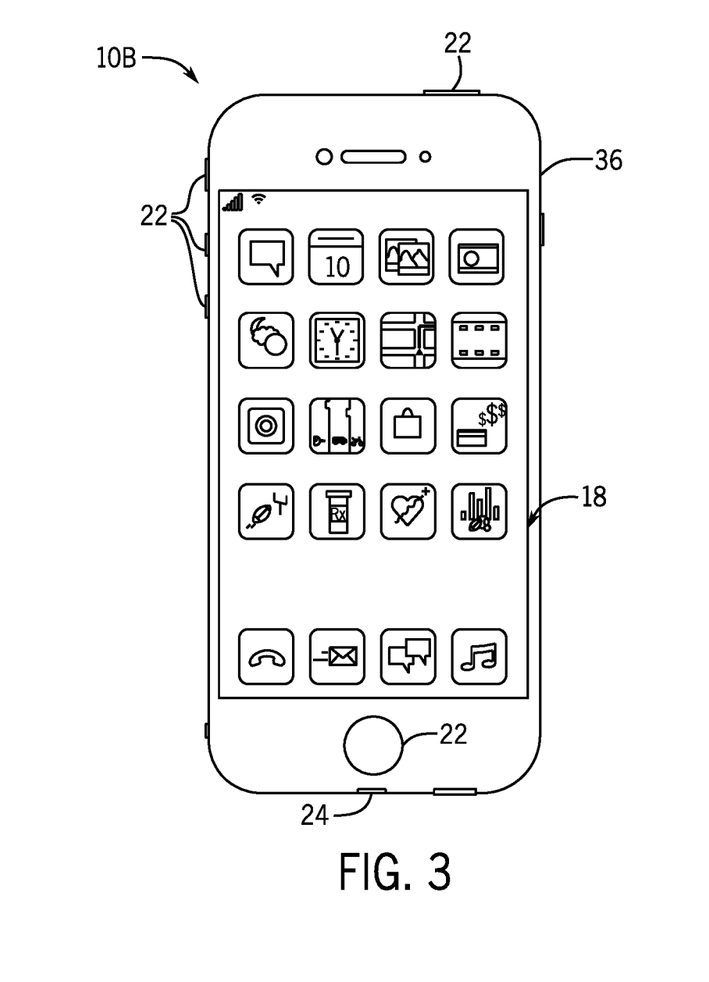
FIG. 3 is a front view of a handheld device representing another embodiment of the electronic device of FIG. 1.
Figure 4:
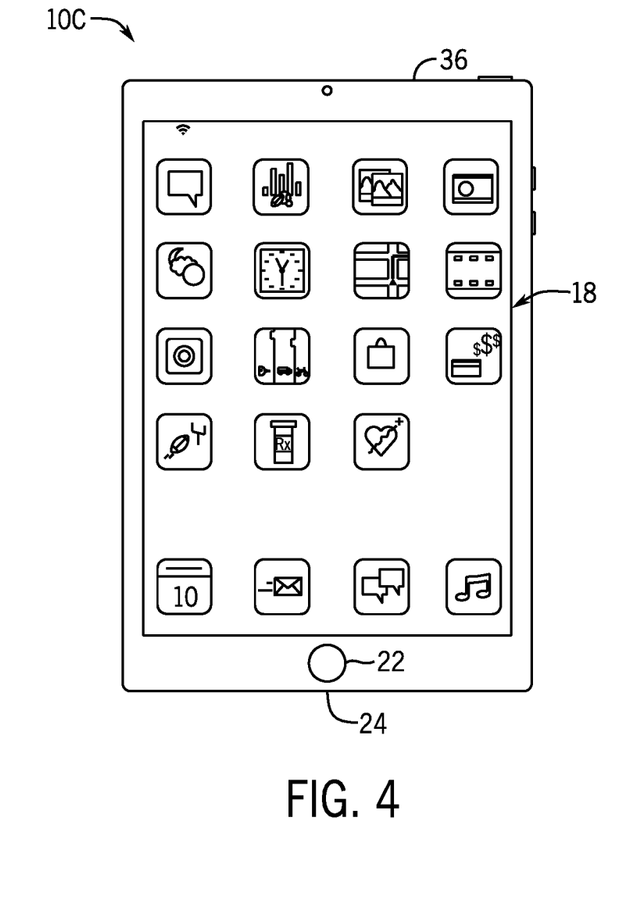
FIG. 4 is a front view of another handheld device representing another embodiment of the electronic device of FIG. 1.
Figure 5:
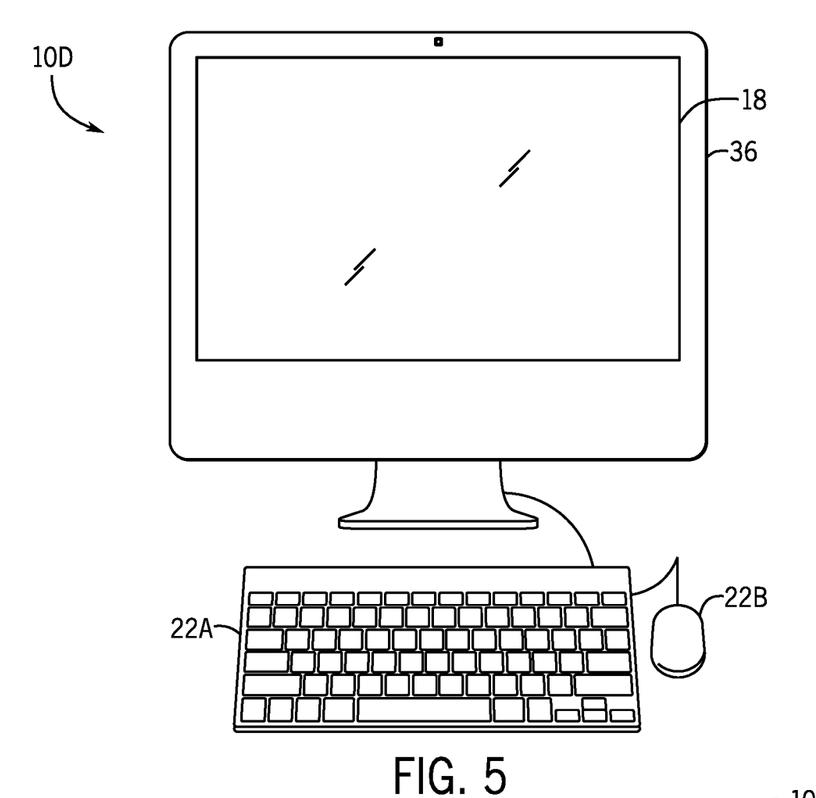
FIG. 5 is a front view of a desktop computer representing another embodiment of the electronic device of FIG. 1.
Figure 6:
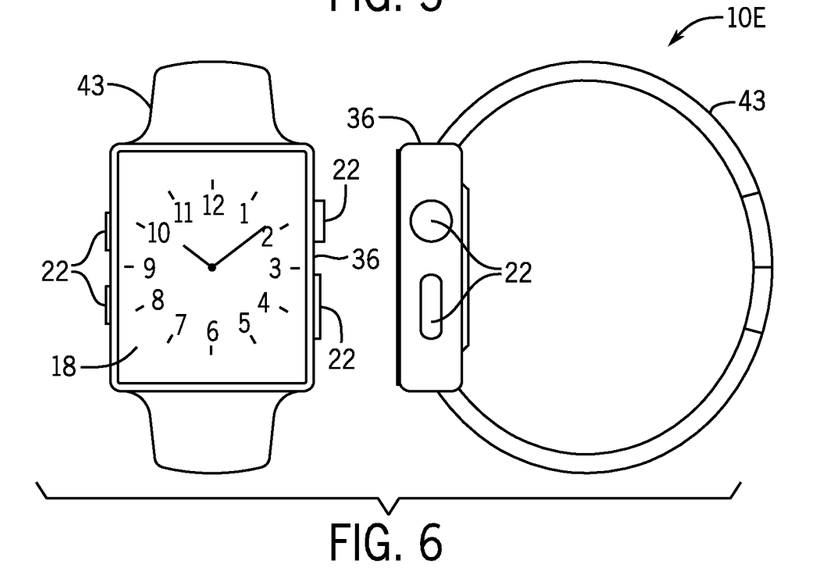
FIG. 6 is a perspective view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, software, hardware, or any combination thereof. Furthermore, the processor(s) 12 and other related items in FIG. 1 may be a single contained processing module or may be incorporated wholly or partially within any of the other elements within the electronic device 10.

In the electronic device 10 of FIG. 1, the processor(s) 12 may be operably coupled with a memory 14 and a nonvolatile storage 16 to perform various algorithms. Such programs or instructions executed by the processor(s) 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, one or more interfaces for a personal area network (PAN), such as a BLUETOOTH® network, for a local area network (LAN) or wireless local area network (WLAN), such as an 802.11x WI-FI® network, and/or for a wide area network (WAN), such as a 3rd generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network. In particular, the network interface 26 may include, for example, one or more interfaces for using a Release-15 cellular communication standard of the 5G specifications that include the millimeter wave (mmWave) frequency range (e.g., 24.25-300 gigahertz (GHz)). The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor core complex 12. The transceiver 30 may support transmission and receipt of various wireless signals via one or more antennas (not shown in FIG. 1). An impedance of the one or more antennas may degrade isolation between the transmitter circuit and the receiver circuit. To prevent such disruption by the antenna, an impedance tuner may be used to match or correlate to an impedance of the antenna.

In some embodiments, the transceiver 30 may include a duplexer (not shown in FIG. 1). A duplexer enables bidirectional communication over a single path while separating signals traveling in each direction from one another. For example, the duplexer may enable frequency division duplexing (FDD), such that the duplexer may isolate a transmitter of the electronic device 10 from a received signal of a first frequency band while isolating a receiver of the electronic device 10 from a transmission signal of a second frequency band (e.g., isolate the transmitter from the receiver, and vice versa). In some embodiments, the duplexer may include multiple variable impedance devices that isolate the transmitter from a received signal and/or isolates the receiver from a transmission signal.

In some embodiments, the electronic device 10 communicates over various wireless networks (e.g., WI-FI®, WIMAX®, mobile WIMAX®, 4G, LTE®, 5G, and so forth) using the transceiver 30. The transceiver 30 may transmit and receive RF signals to support voice and/or data communication in wireless applications such as, for example, PAN networks (e.g., BLUETOOTH®), WLAN networks (e.g., 802.11x WI-FI®), WAN networks (e.g., 3G, 4G, 5G, NR, and LTE® and LTE-LAA cellular networks), WIMAX® networks, mobile WIMAX® networks, ADSL and VDSL networks, DVB-T® and DVB-H® networks, UWB networks, and so forth. The power source 29 of the electronic device 10 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may be generally portable (such as laptop, notebook, and tablet computers), or generally used in one place (such as conventional desktop computers, workstations, and/or servers). In certain embodiments, the electronic device 10 in the form of a computer may be a model of a MacBook®, MacBook® Pro, MacBook Air®, iMac®, Mac® mini, or Mac Pro® available from Apple Inc. of Cupertino, Calif. By way of example, the electronic device 10, taking the form of a notebook computer 10A, is illustrated in FIG. 2 in accordance with one embodiment of the present disclosure. The depicted notebook computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a graphical user interface (GUI) and/or applications running on computer 10A. For example, a keyboard and/or touchpad may allow a user to navigate a user interface and/or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include an enclosure 36 to protect interior components from physical damage and/or to shield them from electromagnetic interference. The enclosure 36 may surround the display 18. The I/O interfaces 24 may open through the enclosure 36 and may include, for example, an I/O port for a hardwired connection for charging and/or content manipulation using a standard connector and protocol, such as the Lightning connector provided by Apple Inc. of Cupertino, Calif., a universal serial bus (USB), or other similar connector and protocol.

The input structures 22, in combination with the display 18, may allow a user to control the handheld device 10B. For example, the input structures 22 may activate or deactivate the handheld device 10B, navigate the user interface to a home screen, a user-configurable application screen, and/or activate a voice-recognition feature of the handheld device 10B. Other input structures 22 may provide volume control, or may toggle between vibrate and ring modes. The input structures 22 may also include a microphone that may obtain a user's voice for various voice-related features, and a speaker that may enable audio playback and/or certain phone capabilities. The input structures 22 may also include a headphone input that may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or another similar device by Apple Inc. of Cupertino, Calif. It should be noted that the computer 10D may also represent a personal computer (PC) by another manufacturer. A similar enclosure 36 may be provided to protect and enclose internal components of the computer 10D, such as the display 18. In certain embodiments, a user of the computer 10D may interact with the computer 10D using various peripheral input structures 22, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may operate using the techniques described herein. By way of example, the wearable electronic device 10E, which may include a wristband 43, may be an Apple Watch® by Apple Inc. of Cupertino, Calif. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, LED display, OLED display, active-matrix organic light emitting diode (AMOLED) display, and so forth), as well as input structures 22, which may allow users to interact with a user interface of the wearable electronic device 10E.

As mentioned above, the transceiver 30 of the electronic device 10 may include a transmitter and a receiver that are coupled to an antenna to enable the electronic device 10 to transmit and receive wireless signals. Certain electronic devices may include isolation circuitry having multiple variable impedance devices that isolate the transmitter from received signals, and the receiver from transmission signals, thus reducing interference when communicating. In such electronic devices, an impedance tuner may be used to balance the impedance of the antenna to increase effectiveness of this isolation. However, the transmission path for transmission signals sent from the transmitter may branch between the antenna and the impedance tuner. As a result, some of the power used to transmit a transmission signal through the antenna may be lost (e.g., referred to as insertion loss) when the transmission signal branches to the impedance tuner. Similarly, the reception path for received signals received from the antenna may branch between the receiver and the transmitter. As a result, some of the power in the received signal received at the receiver may be lost (e.g., insertion loss) when the received signal branches toward the transmitter.

Embodiments herein provide various apparatuses and techniques to reduce insertion loss while maintaining isolation of the transmitter and receiver of the electronic device 10. To do so, the embodiments disclosed herein include a frequency dependent isolation circuit. The isolation circuit includes multiple variable impedance devices. At least one variable impedance device is disposed on a transmit path from the transmitter to one or more antennas and at least one variable impedance device is installed on a receive path from the one or more antennas to the receiver.

At a frequency range of the transmission signal, the impedances of the variable impedance devices and the one or more antennas operate in a balanced state, isolating the receiver circuit from the transmission signal. That is, the impedances are configured to effectively remove the receiver circuit from the transceiver circuitry and direct the transmission signal away from the receiver circuit and to the one or more antennas. Similarly, at a frequency range of the received signal, the impedances of the variable impedance devices and the one or more antennas operate in a balanced state to direct the received signal to the receiver circuit and away from the transmitter circuit. Further, the impedances of the variable impedance devices direct a noise signal having a frequency in the frequency range of the received signal and generated by the transmitter circuit away from the receiver circuit. Thus, the impedances of the variable impedance devices may be configured to isolate the receiver circuit from the transmission signal and a noise signal generated by the transmitter circuit. Further, the impedances of the variable impedance devices may be configured to isolate the transmitter circuit from the received signal. The impedances of the variable impedance devices may be different at the frequency range of the transmission signals than at the frequency range of the received signals.

In some embodiments, the transmitter may generate a noise signal (e.g., due to non-linear characteristics and/or real-world imperfections of a power amplifier of the transmitter) at a frequency supported by the receiver. In that case, the noise signal may propagate to the receiver and interfere with the received signal. To prevent such interference, an impedance of the variable impedance devices may be frequency dependent such that receiver is isolated from the noise signal, as discussed below.

Figure 7:
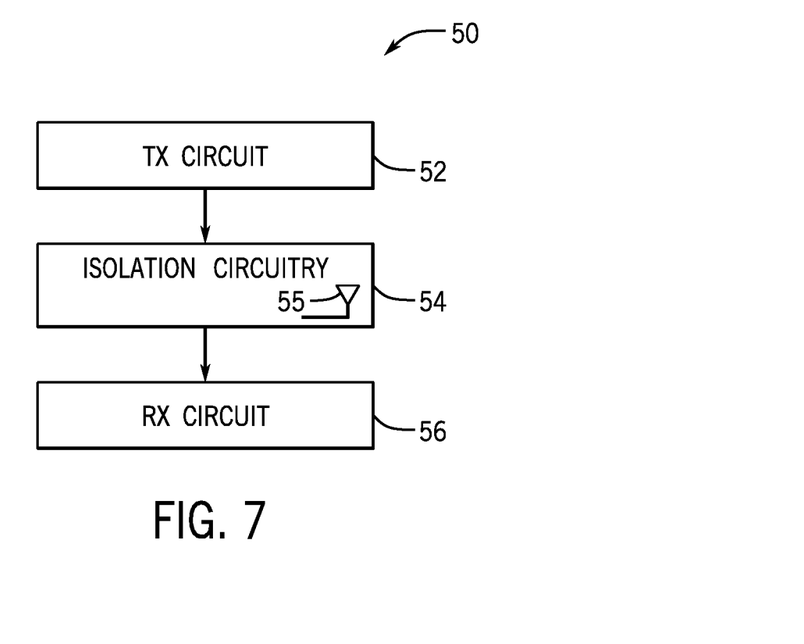
FIG. 7 is a block diagram of example transceiver circuitry of the electronic device of FIG. 1, according to an embodiment of the present disclosure.

With the foregoing in mind, FIG. 7 is a block diagram of example transceiver circuitry 50 of the electronic device 10, according to an embodiment of the present disclosure. In some embodiments, the example transceiver circuitry 50 may be disposed in the transceiver 30 discussed with respect to FIG. 1. In other embodiments, the transceiver circuitry 50 may be disposed in the network interface 26 and coupled to the transceiver 30.

As illustrated, the transceiver circuitry 50 includes an isolation circuit 54 disposed between a transmit (TX) circuit 52 and a receive (RX) circuit 54. The isolation circuit 54 is communicatively coupled to the TX circuit 52 and the RX circuit 56. In some embodiments, the isolation circuit 54 includes one or more antennas 55 therein. In some alternative embodiments, the one or more antennas 55 may be coupled to the isolation circuit 54. The isolation circuit 54 enables signals (e.g., transmission signals) of a first frequency range from the TX circuit 52 to pass through to the one or more antennas 55 and blocks the signals of the first frequency range from passing through to the RX circuit 56. The isolation circuit 54 also enables signals (e.g., received signals) of a second frequency range received via the one or more antennas 55 to pass through to the RX circuit 56 and blocks the signals of the second frequency range from passing through to the TX circuit 52. Each frequency range may be of any suitable bandwidth, such as between 1 and 100 gigahertz (GHz) (e.g., 10 megahertz (MHz)), and include any suitable frequencies. For example, the first frequency range (e.g., the TX frequency range) may be between 880 and 890 MHz, and the second frequency range (e.g., the RX frequency range) may be between 925 and 936 MHz.

In some embodiments, the isolation circuit 54 isolates the RX circuit 56 from noise signals generated by the TX circuit 52. For example, when transmitting a transmission signal, due to non-linear characteristics and/or real-world imperfections of a power amplifier of the TX circuit 52, the TX circuit 52 may generate a noise signal. If a frequency of the noise signal is within the RX frequency range (e.g., is a frequency supported by the RX circuit 56), the noise signal may interfere with an RX signal and/or the RX circuit 56. To prevent such interference, the isolation circuit 54 may isolate the RX circuit 56 from the noise signal.

Figure 8A:
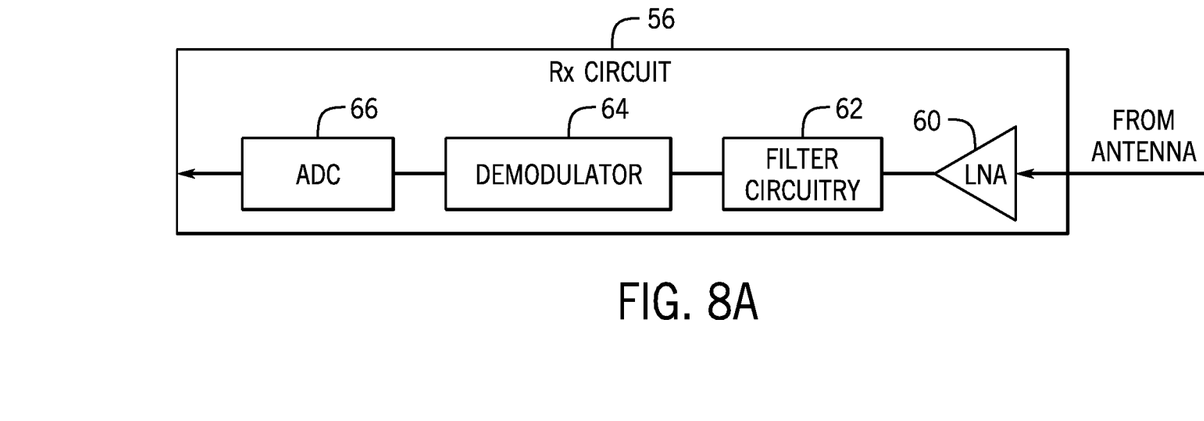
FIG. 8A is a block diagram of an example receiver circuit of the example transceiver circuitry of FIG. 7, according to an embodiment of the present disclosure.

FIG. 8A is a block diagram of an example receiver circuit (e.g., the RX circuit) 56 of the example transceiver circuitry of FIG. 7, according to an embodiment of the present disclosure. As illustrated, the RX circuit 56 may include, for example, a low noise amplifier (LNA) 60, filter circuitry 6262, a demodulator 64, and an analog-to-digital converter (ADC) 66. One or more signals received by the one or more antennas 55 may be sent to the RX circuit 56 via the isolation circuit 54. In some embodiments, the RX circuit 56 may include components in addition to or alternative to the LNA 60, filter circuitry 62, the demodulator 64, and the ADC 66, such as a mixer, a digital down converter, and the like.

The LNA 60 and filter circuitry 62 may receive the RX signal received by the one or more antennas 55. The LNA 60 may amplify the combined RX signal to a suitable level for the rest of the circuitry to process. The filter circuitry 62 may include one or more types of filters such as bandpass filter, a low pass filter, or a decimation filter, or any combination thereof. The filter circuitry 62 may remove undesired noise from the RX signal, such as cross-channel interference. The filter circuitry 62 may also remove additional signals received by the one or more antennas 55 which are at frequencies other than the desired signal.

The filtered RX signal is sent to the demodulator 64. The demodulator 64 may remove the RF envelope and extract a demodulated signal from the filtered RX signal for processing. The ADC 66 receives the demodulated analog signal and converts the signal to a digital signal so that it can be further processed by the electronic device 10.

Figure 8B:
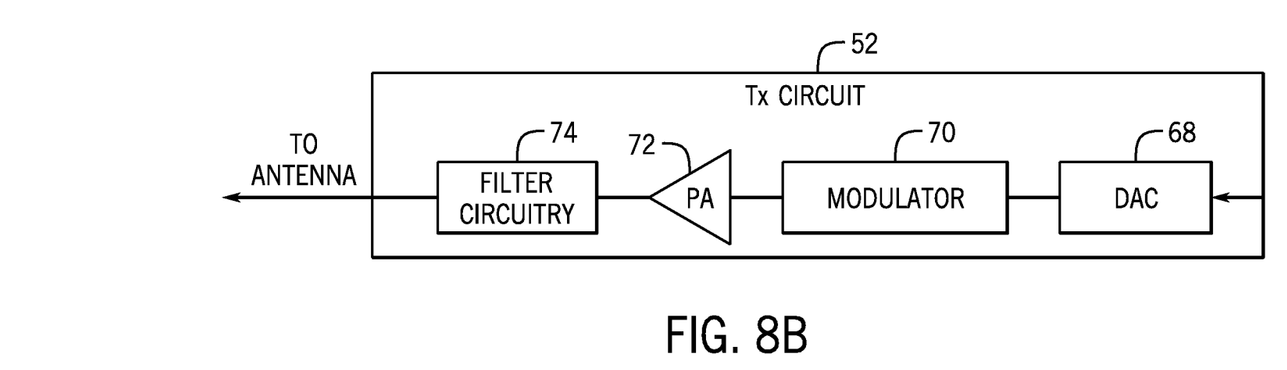
FIG. 8B is a block diagram of an example transmitter circuit of the example transceiver circuitry of FIG. 7, according to an embodiment of the present disclosure.

FIG. 8B is a block diagram of an example transmitter circuit (e.g., the TX circuit) 52 of the example transceiver circuitry of FIG. 7, according to an embodiment of the present disclosure. As illustrated, the TX circuit 52 may include, for example, filter circuitry 74, a power amplifier (PA) 72, a modulator 70, and a digital-to-analog converter (DAC) 68. In some embodiments, the TX circuit 52 may include components in addition to or alternative to the filter circuitry 74, the PA 72, the modulator 70, and the DAC 68, such as a digital up converter, etc.

A digital signal containing information to be transmitted via the one or more antennas 55 is provided to the DAC 68. The DAC 68 converts the digital signal from the transmitter of the transceiver 30 to an analog signal. The modulator 70 may combine the converted analog signal with a carrier signal to generate a radio wave.

The PA 72 receives the modulated signal from the modulator 70. The PA 72 amplifies the modulated signal to a suitable level to drive transmission of the signal via the one or more antennas 55. Similar to the filter circuitry 62, the filter circuitry 74 of the TX circuit 52 may remove undesirable noise from the amplified signal to be transmitted via the one or more antennas 55. In some embodiments, a PA, such as the PA 72, may be disposed within the transceiver 30 in addition to or in the alternative to the PA 72 in the TX circuit 52.

Figure 9A:
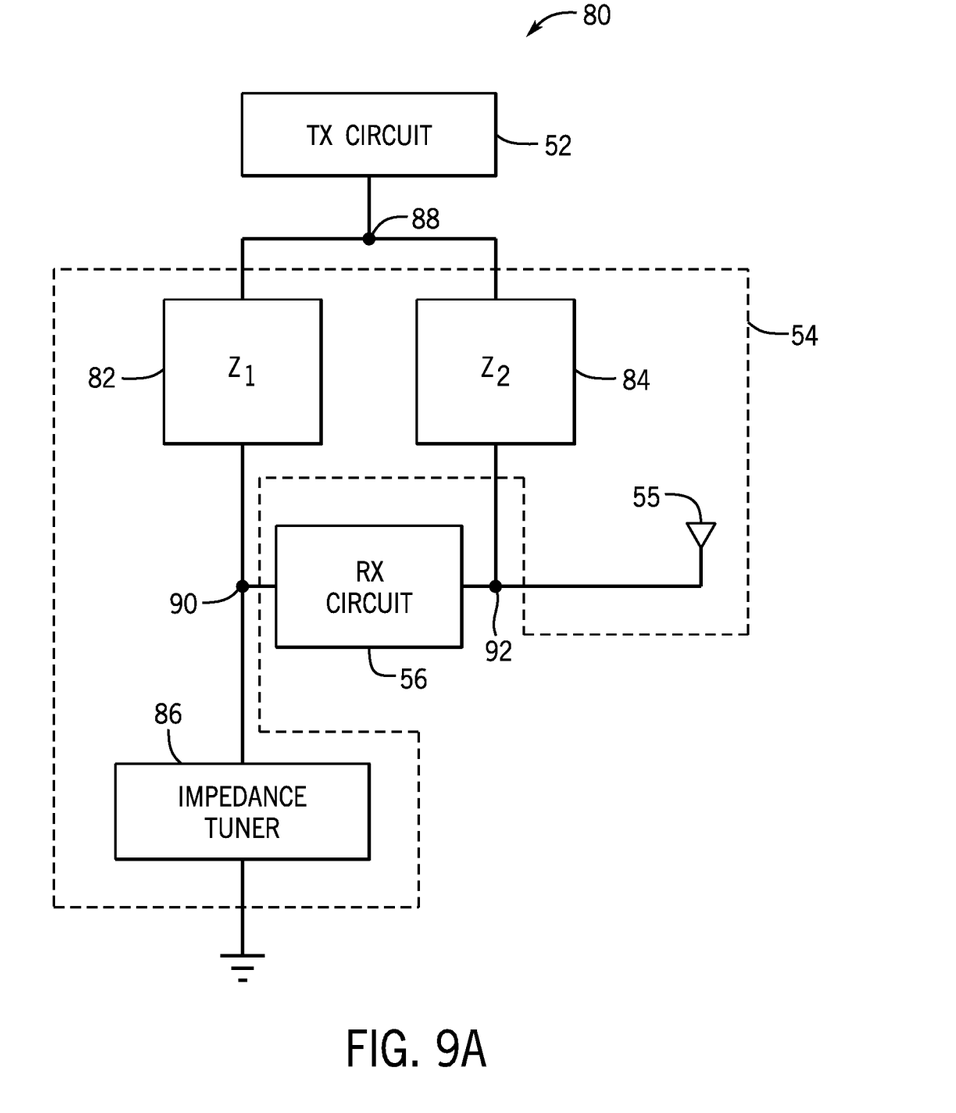
FIG. 9A is a schematic diagram of the example transceiver circuitry of FIG. 7 illustrating components of isolation circuitry of the example transceiver circuitry, according to an embodiment of the present disclosure.

FIG. 9A is a schematic diagram of example transceiver circuitry 80 illustrating components of the isolation circuit 54, according to an embodiment of the present disclosure. The transceiver circuitry 80 may correspond to the example transceiver circuitry 70 of FIG. 7. For example, the transceiver circuitry 80 includes the TX circuit 52, the isolation circuit 54, and the RX circuit 56. As illustrated, the isolation circuit 54 includes a first variable impedance device 82, a second variable impedance device 84, a third variable impedance device 86, and the one or more antennas 55. In some embodiments, the transceiver circuitry may be configured in a ladder arrangement. That is, the TX circuit 52, the RX circuit 56, the variable impedance devices 82, 84, 86 and the one or more antennas 55 may be configured such that when the impedances of the variable impedance devices 82, 84, 86 and the one or more antennas 55 are in a balanced state, the RX circuit 56 is isolated (e.g., from the standpoint of the TX circuit 52).

In some embodiments, the variable impedance devices 82, 84, 86 may be implemented as impedance gradients. In some alternative embodiments, the variable impedance devices 82, 84, 86 may be implemented as impedance tuners. In still some other embodiments, the variable impedance devices 82, 84, 86 may be implemented as a combination of impedance gradients and impedance tuners. For example, as illustrated, the first variable impedance device 82 and the second variable impedance device 84 may be implemented as impedance gradients and the third variable impedance device 86 may be implemented as an impedance tuner.

An impedance gradient, such as variable impedance devices 82, 84, may operate as an impedance switch, and provide a first impedance state (e.g., a lower impedance) in a first operating mode and a second impedance state (e.g., a higher impedance) in a second operating mode. For example, the first impedance state may approach or appear as a short or closed circuit (e.g., approaching or approximately equal to zero ohms, such as between 0 and 100 ohms, 0.1 and 10 ohms, 0.5 and 2 ohms, and so on), while the second impedance state may approach or appear as an open circuit (e.g., providing an impedance greater than the first impedance state, such as greater than 10000 ohms, greater than 1000 ohms, greater than 100 ohms, greater than 10 ohms, greater than 5 ohms, and so on). An impedance switch may be made of any suitable circuit components that enable the first and second impedance states, such as, for example, inductors and capacitors, as discussed with respect to FIG. 10.

An impedance tuner, such as the variable impedance device 86, may operate as a tunable impedance device, and provide multiple impedance states. For example, the impedance states may include a first impedance state approaching or appearing as a short or closed circuit (e.g., approaching or approximately equal to zero ohms, such as between 0 and 100 ohms, 0.1 and 10 ohms, 0.5 and 2 ohms, and so on), a second impedance state approaching or appearing as an open circuit (e.g., providing an impedance greater than the first impedance state, such as greater than 50000 ohms, such as greater than 10000 ohms, greater than 1000 ohms, greater than 100 ohms, greater than 10 ohms, greater than 5 ohms, and so on), and multiple states providing impedances (e.g., between 0 and 50000 ohms) in between the first and second impedance states. An impedance tuner may be made of any suitable circuit components that enable the multiple impedance states, such as, for example, inductors and capacitors, as discussed with respect to FIG. 10.

As discussed above, the impedance of the impedance tuner 86 may be configured to match or correlate to an impedance of the one or more antennas 55. It should be understood that these impedance devices are provided as examples, and any suitable device that provides different impedance states and/or values, such as an impedance switch or variable impedance device, is contemplated.

The first variable impedance device 82 is coupled to the TX circuit 52 via a first node 88 and is coupled to the RX circuit 56 via a second node 90. The second variable impedance device 84 is coupled to the TX circuit 52 via the first node 88 and is coupled to the RX circuit 56 via a third node 92. The one or more antennas 55 are coupled to the second impedance device 84 and the RX circuit 56 via the third node. The third variable impedance device 86 is coupled to the first variable impedance device 82 and the RX circuit 56 via the second node 90.

As discussed above, the isolation circuit 54 isolates the RX circuit 56 from a TX signal propagating from the TX circuit 52 to the one or more antennas 55 while enabling the TX signal to propagate from the TX circuit to the one or more antennas 55. That is, each of the impedance values of the first variable impedance device 82 and the third variable impedance device 86 may be greater than impedance values of the second variable impedance device 84 and the one or more antennas 55, such that the TX signal propagates along a path having the lower impedance from the TX circuit 52 through the second variable impedance device 84 and ultimately to the one or more antennas 55 to be transmitted therefrom.

When the TX signal is generated and transmitted by the TX circuit 52, a noise signal may also be generated by and transmitted by the TX circuit 52 due to non-linear characteristics and/or real-world imperfections of the power amplifier 72 of the TX circuit 52. A frequency of the noise signal may be within the RX frequency range, and, if left unblocked, may propagate through the second variable impedance device 84 and to the RX circuit 56. In such cases, the noise signal may be received by the RX circuit 56 and processed as the RX signal, and/or the noise signal may interfere with the RX signal. To prevent such interference, the variable impedance devices 82, 84, 86 may be frequency dependent and have impedances configured to direct the various signals (e.g., the TX signal and the RX signal) through lower impedance paths and block signals using higher impedance paths. A frequency dependent variable impedance device may have a first impedance for a signal in a first frequency range and a second impedance for a signal in a second frequency range. Thus, the impedances of the variable impedance devices 82, 84, 86 and the one or more antennas 55 may be configured to enable the TX signal to propagate to and be transmitted via the one or more antennas 55 while isolating the RX circuit 56 from the TX signal. Similarly, the impedances may be configured to isolate the RX circuit 56 from the noise signal generated by the TX circuit 52.

To isolate the RX circuit 56 from the standpoint of the TX circuit 52, the impedances of the variable impedance devices 82, 84, 86 may be configured such that a ratio of the impedance of the first variable impedance device 82 to the impedance of the third impedance device 86 is substantially equivalent to a ratio of the second variable impedance device 84 to the impedance of the one or more antennas 55 for both the TX frequency range and the RX frequency range (e.g., even though the impedances of the variable impedance devices 82, 84, 86 may be different for the TX frequency range when compared to that of the RX frequency range). This relationship may also be expressed as when the product of the impedance of the one or more antennas 55 and the impedance of the first variable impedance device 82 is substantially equivalent to the product of the impedance of the second variable impedance device 84 and the impedance of the third impedance device 86. This is referred to as placing the impedances of the variable impedance devices 82, 84, 86 and the one or more antennas 55 in a "balanced" state. As an example, at the TX frequency range, the impedance of the first variable impedance device 82 may be 100 ohms, the impedance of the second variable impedance device 84 may be 1 ohm, the impedance of the third variable impedance device 86 may be 5000 ohms, and the impedance of the one or more antennas 55 may be 50 ohms. At the RX frequency range, the impedance of the first variable impedance device 82 may be 20 ohms, the impedance of the second variable impedance device 84 may be 1 ohm, the impedance of the third variable impedance device 86 may be 5000 ohms, and the impedance of the one or more antennas 55 may remain unchanged at 50 ohms. It should be understood that these resistance values are provided as examples, and any suitable resistance values of the variable impedance devices 82, 84, 86 and the one or more antennas 55 are contemplated, such that the impedances are placed in a balanced state to enable isolation of the RX circuit 56.

Advantageously, the arrangement of the variable impedance devices 82, 84, 86 and the one or more antennas 55 may operate like a bridge circuit, such as a Wheatstone bridge circuit. That is, the impedances of the variable impedance devices 82, 84, 86 and the impedance of the one or more antennas 55 are balanced such that substantially zero voltage or current exists across the RX circuit 56. Thus, the RX circuit 56 is effectively removed from the transceiver circuitry 80 for the TX signal, thus isolating the RX circuit 56 from the TX signal and the noise signal generated by the TX circuit 52. On the other hand, the impedances of the variable impedance devices 82, 84, 86 and the impedance of the one or more antennas 55 allow the RX signal received by the one or more antennas 55 to propagate to the RX circuit 56, as the RX signal will not encounter the impedance ladder. Advantageously, the substantial balancing of the impedances in the transceiver circuitry (e.g., the substantial equivalence of the impedance ratios) provides an improved isolation of the RX circuit 56 from the TX signal and the noise signal generated by the TX circuit.

In some embodiments, a location of the TX circuit 52 and a location of the RX circuit 56 may be switched in the transceiver circuitry 80. That is, the RX circuit 56 may be coupled to the first variable impedance device 82 and the second variable impedance device 84 via the first node 88. The TX circuit 52 may be coupled to the one or more antennas 55 and the second variable impedance device 84 via the third node 92 and coupled to the first variable impedance device and the third variable impedance device 86 via the second node 90. In that case, the impedances of the variable impedance devices 82, 84, 86 may be changed such that the TX circuit 52 is isolated from the RX signal and a noise signal generated by the RX circuit 56 having a frequency in the TX frequency range (e.g., a frequency supported by the TX circuit 52).

Figure 9B:
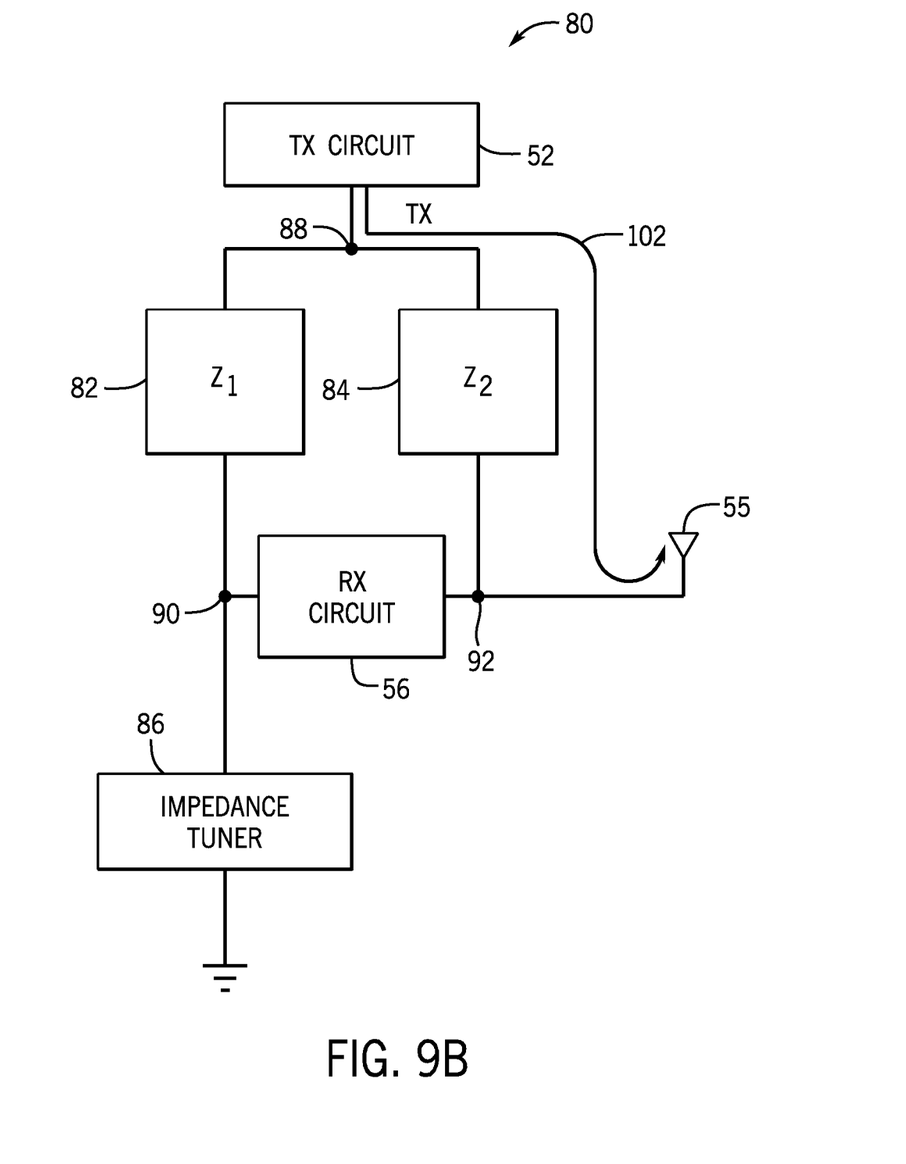
FIG. 9B is a schematic diagram of the example transceiver circuitry of FIG. 9A illustrating a path of a transmission (TX) signal, according to an embodiment of the present disclosure.

FIG. 9B is a schematic diagram of the example transceiver circuitry 80 of FIG. 9A illustrating a path 102 of a transmission (TX) signal, according to an embodiment of the present disclosure. As discussed above, the TX signal 102 is generated and/or transmitted by the TX circuit 52 to the one or more antennas 55 for transmission. For the TX frequency range, the impedance of the first variable impedance device 82 is greater than the impedance of the second variable impedance device 84 and the one or more antennas 55. Additionally, the impedance of the third variable impedance device 86 is greater than the impedance of the first variable impedance device 82, the second variable impedance device 84, and the one or more antennas 55. Moreover, the impedance of the second variable impedance device 84 is less than the impedance of the one or more antennas 55. For example, the impedance of the first variable impedance device 82 may be 100 ohms, the impedance of the second variable impedance device 84 may be 1 ohm, the impedance of the third variable impedance device 86 may be 5000 ohms, and the impedance of the one or more antennas 55 may be 50 ohms. It should be understood that these impedance values are provided as examples, and any suitable impedance values of the variable impedance devices 82, 84, 86 and the one or more antennas 55 are contemplated, such that the impedances are placed in a balanced state to enable isolation of the RX circuit 56. Thus, the path 102 of the TX signal goes from the TX circuit 52 to the lower impedance of the second variable impedance device 84 and ultimately to the TX circuit 52.

The TX signal does not propagate to the first variable impedance device 82 because, as discussed above, the impedance of the first variable impedance device 82 is greater than the impedance of the second variable impedance device 84 at the TX frequency range. Similarly, the TX signal propagates along the path 102 from the second variable impedance device 84 to the one or more antennas 55 because the impedance of the one or more antennas 55 is less than the impedance of the third variable impedance device 86. Advantageously, for the TX signal, the RX circuit 56 is effectively removed from the transceiver circuitry 80 due to the balanced impedances of the variable impedance devices 82, 84, 86 and the one or more antennas 55. Thus, the RX circuit 56 is isolated from the TX signal.

Figure 9C:
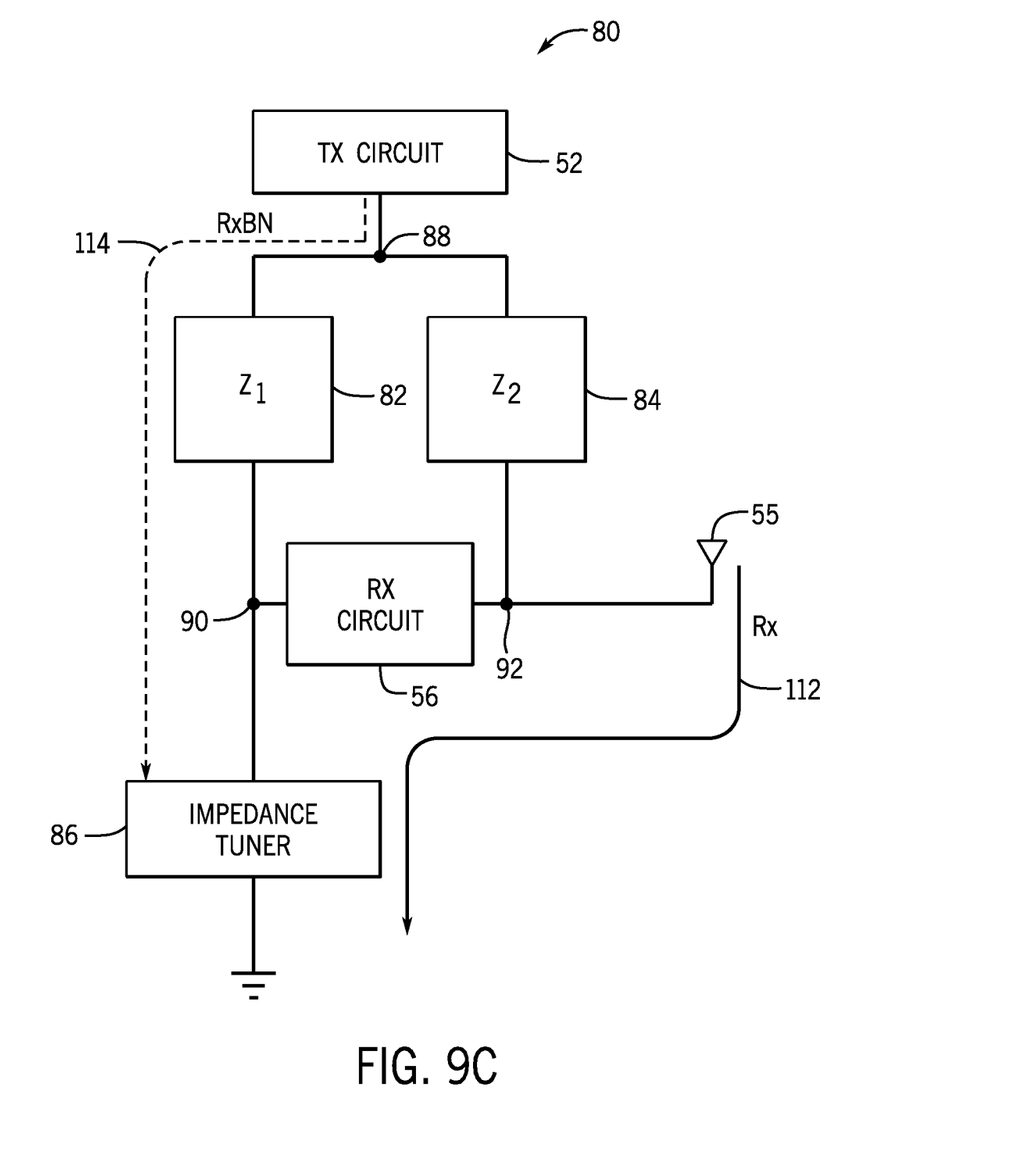
FIG. 9C is a schematic diagram of the example transceiver circuitry of FIG. 9A illustrating a path of a received (RX) signal, according to an embodiment of the present disclosure.

FIG. 9C is a schematic diagram of the example transceiver circuitry 80 of FIG. 9A illustrating a path 112 of a received (RX) signal, according to an embodiment of the present disclosure. At the RX frequency range, the impedance of the second variable impedance device 84 is higher than the impedance of the first variable impedance device 82, the third variable impedance device 86, and the one or more antennas 55. Additionally, the impedance of the first variable impedance device 82 is greater than the impedance of the third variable impedance device 86 and less than the impedance of the one or more antennas 55. Moreover, the impedance of the third variable impedance device 86 is less than the impedance of the one or more antennas 55. For example, the impedance of the impedance of the first variable impedance device 82 may be 20 ohms, the impedance of the second variable impedance device 84 may be 1 ohm, the impedance of the third variable impedance device 86 may be 5000 ohms, and the impedance of the one or more antennas 55 may remain unchanged at 50 ohms. It should be understood that these impedance values are provided as examples, and any suitable impedance values of the variable impedance devices 82, 84, 86 and the one or more antennas 55 are contemplated, such that the impedances are placed in a balanced state to enable isolation of the RX circuit 56. That is, the impedances of the variable impedance devices 82, 84, 86 are different at the RX frequency range than at the TX frequency range. However, the impedances of the variable impedance devices 82, 84, 86 remain balanced at the RX frequency range to isolate the RX circuit 56. That is, the ratio of the impedance of the first variable impedance device 82 to the impedance of the third variable impedance device 86 is substantially equivalent to the ratio of the impedance of the second variable impedance device 84 to the impedance of the one or more antennas 55, at the RX frequency.

As discussed above, the RX signal is received via the one or more antennas 55 and propagates along the path 112 to the RX circuit 56. The path 112 has a lower impedance than alternative paths for the RX signal. Thus, the RX signal propagates along the path 114 to the RX circuit. The RX signal does not propagate toward the TX circuit 52 via the second variable impedance device 84 or the first variable impedance device 82 because, at the RX frequency range, the impedance of the third variable impedance device 86 is less than the impedance of the first variable impedance device 82 and the second variable impedance device 84. Thus, the variable impedance devices 82, 84, 86 and the one or more antennas 55 isolate the TX circuit 52 from the RX signal.

As discussed above, the TX circuit 52 may generate a noise signal (e.g., RXBN) with a frequency of the RX signal. To prevent the RXBN signal from propagating to the RX circuit 56, the impedance of the first variable impedance device 82 is less than the impedance of the second variable impedance device 84. Similarly, the impedance of the third variable impedance device 86 is less than the impedance of the one or more antennas 55. Additionally, the balanced impedances of the variable impedance devices 82, 84, 86 effectively remove the RX circuit 56 from the transceiver circuitry 80 from the standpoint of the TX circuit 52 and prevent the RXBN signal from reaching the RX circuit 56. Thus, the variable impedance devices 82, 84, 86 and the one or more antennas 55 cause the RXBN signal to propagate along a path 114 from the TX circuit 52 through the first variable impedance device 82 and the third variable impedance device 86, and prevent the RXBN signal from propagating to the RX circuit 56. In this way, the variable impedance devices 82, 84, 86 and the one or more antennas 55 isolate the RX circuit 56 from the RXBN signal and prevent interference therefrom.

In some embodiments, an impedance of the first variable impedance device 82 is higher for the TX frequency range (e.g., during transmit operations) than for the RX frequency range (e.g., during receive operations). Additionally or alternatively, the impedance of the second variable impedance device 84 is higher for RX frequency range than for the TX frequency range. Moreover, an impedance of the third variable impedance device 86 is higher for the TX frequency range than for the RX frequency range.

Figure 10:
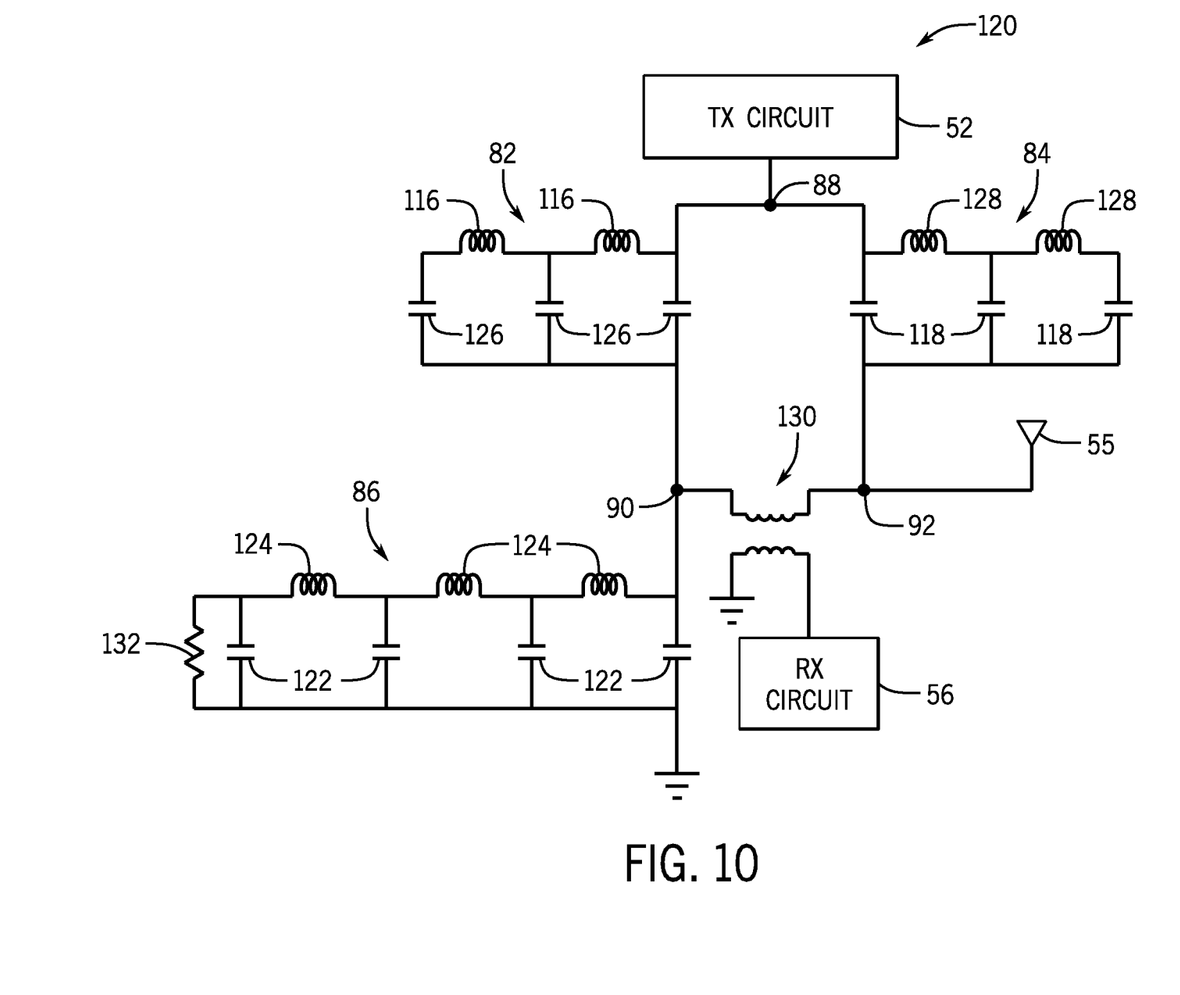
FIG. 10 is a circuit diagram of the example transceiver circuitry of FIG. 9A, according to an embodiment of the present disclosure.

FIG. 10 is a circuit diagram of an example transceiver circuitry 120 of the electronic device 10, according to an embodiment of the present disclosure. The example transceiver circuitry 120 is substantially similar to the transceiver circuitry 80 of FIG. 9A except that the transceiver circuitry 120 includes example circuitry for the variable impedance devices 82, 84, 86. The circuitry of the variable impedance devices 82, 84, 86 may include any circuit with a steep frequency behavior, such as a Pi network, a surface acoustic wave filter, a resonant circuit (e.g., LC circuit), etc.

As an example, the first variable impedance device 82 includes a parallel arrangement of inductors 116 coupled in series with capacitors 126. Similarly, the second variable impedance device 84 includes a parallel arrangement of inductors 128 coupled in series with capacitors 118. The third variable impedance device 86 includes a parallel arrangement of inductors 124 coupled in series with capacitors 122. The third variable impedance device 86 also includes a resistor 132 coupled in parallel with the parallel arrangement.

As discussed above, the impedances of the variable impedance devices 82, 84, 86 and the one or more antennas 55 are balanced to effectively remove the RX circuit from the transceiver circuitry 120 at the TX frequency range. Thus, the balanced impedances direct the TX signal from the TX circuit 52 to the one or more antennas 55 and isolate the RX circuit 56 from the TX signal. Further, the impedances guide the RX signal from the one or more antennas 55 to the RX circuit 56 and guide the noise signal generated by the TX circuit 52 away from the RX circuit 56. That is, the impedances of the variable impedance devices 82, 84, 86 and the one or more antennas 55 enable isolation of the RX circuit 56 from the TX signal and the noise signal generated by the TX circuit 52 and isolation of the TX circuit 52 from the RX signal.

In some embodiments, the RX circuit 56 may be coupled to the transceiver circuitry 30 via a balun (e.g., a transformer balun) 130. The balun 130 may further improve isolation of the RX circuit 56 from the TX signal and/or the RXBN signal. Thus, the balun 130 may facilitate reducing insertion loss between the one or more antennas 55 and the third variable impedance device 86.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device comprising:
a transmit circuit configured to generate a transmission signal;
a receive circuit configured to receive a receive signal; and
an isolation circuit including:
one or more antennas having a first impedance, the one or more antennas communicatively coupled to the transmit circuit via a transmit path, and the one or more antennas communicatively coupled to the receive circuit via a receive path;
a first variable impedance device disposed in the transmit path and having a first variable impedance;
a second variable impedance device disposed between the transmit circuit and the receive circuit and having a second variable impedance; and
a third variable impedance device coupled between the receive circuit and the second variable impedance device and having a third variable impedance, wherein the first variable impedance device, the second variable impedance device, and the third variable impedance device are configured to isolate the receive circuit from the transmission signal and from a noise signal generated by the transmit circuit having a frequency of the receive signal when a ratio of the first variable impedance to the first impedance is equal to a ratio of the second variable impedance to the third variable impedance.

2. The electronic device of claim 1, wherein the isolation circuit is configured to isolate the receive circuit from the transmission signal by balancing the first impedance, the first variable impedance, the second variable impedance, and the third variable impedance, thereby causing zero voltage across the receive circuit.

3. The electronic device of claim 1, wherein the first variable impedance varies from a second impedance during transmit operations to a third impedance higher than the second impedance during receive operations, the second variable impedance varies from a fourth impedance during the receive operations to a fifth impedance less than the fourth impedance during the transmit operations, and the third variable impedance varies from a sixth impedance during the transmit operations to a seventh impedance lower than the sixth impedance during the receive operations.

4. The electronic device of claim 3, wherein a ratio of the fifth impedance to the seventh impedance is equal to a ratio of the third impedance to the first impedance during the receive operations and a ratio of the fourth impedance to the sixth impedance is equal to a ratio of the second impedance to the first impedance during the transmit operations.

5. The electronic device of claim 1, comprising a balun disposed between and coupling the receive circuit and the isolation circuit.

6. The electronic device of claim 1, wherein each of the first variable impedance device, the second variable impedance device, and the third variable impedance device comprises an impedance gradient or an impedance tuner.

7. The electronic device of claim 1, wherein the first variable impedance and the second variable impedance device each comprises a parallel arrangement of a plurality of inductors coupled in series with a plurality of capacitors.

8. The electronic device of claim 1, wherein the third variable impedance device comprises a resistor coupled in parallel with a parallel arrangement of a plurality of inductors coupled in series with a plurality of capacitors.

9. The electronic device of claim 1, wherein the first variable impedance device, the second variable impedance device, and the third variable impedance device are configured to direct the noise signal from the transmit circuit to the second variable impedance device and the third variable impedance device.

10. An electronic device comprising:
one or more antennas having a first impedance;
transmitter circuitry configured to transmit a transmission signal via the one or more antennas;
receiver circuitry configured to receive a receive signal via the one or more antennas;
a first variable impedance device having a first variable impedance;
a second variable impedance device having a second variable impedance, the transmitter circuitry, the first variable impedance device, and the second variable impedance device communicatively coupled together via a first node;
a third variable impedance device having a third variable impedance, the first variable impedance device, the receiver circuitry, and the third variable impedance device communicatively coupled together via a second node, and the second variable impedance device, the receiver circuitry, and the one or more antennas coupled together via a third node.

11. The electronic device of claim 10, wherein the first impedance, the first variable impedance, the second variable impedance, and the third variable impedance are configured to isolate the receiver circuitry when a ratio of the first variable impedance to the third variable impedance is equal to a ratio of the second variable impedance to the first impedance.

12. The electronic device of claim 10, wherein the first variable impedance, the second variable impedance, and the third variable impedance are frequency dependent.

13. The electronic device of claim 10, wherein the first variable impedance is greater than the second variable impedance at a first frequency, the first variable impedance device is less than the third variable impedance at the first frequency, the first variable impedance is less than the second variable impedance at a second frequency, and the first variable impedance is greater than impedance of the third variable impedance device at the second frequency.

14. The electronic device of claim 10, wherein the third variable impedance is less than each of the first variable impedance, the second variable impedance, and the first impedance at a frequency of the receive signal.

15. The electronic device of claim 14, wherein the receiver circuitry is configured to be isolated from the transmission signal when a ratio of the first variable impedance to the third variable impedance is substantially equivalent to a ratio of the second variable impedance to the first impedance.

16. The electronic device of claim 10, wherein the first variable impedance varies from a second impedance during transmit operations to a third impedance higher than the second impedance during receive operations, the second variable impedance varies from a fourth impedance during the receive operations to a fifth impedance less than the fourth impedance during the transmit operations, and the third variable impedance varies from a sixth impedance during the transmit operations to a seventh impedance lower than the sixth impedance during the receive operations.

17. The electronic device of claim 16, wherein a ratio of the seventh impedance to the fifth impedance is equal to a ratio of the third impedance to the first impedance during the receive operations and a ratio of the sixth impedance to the fifth impedance is equal to a ratio of the second impedance to the first impedance during the transmit operations.

18. An electronic device, comprising:
a transmitter configured to transmit a transmission signal;
a receiver configured to receive a receive signal; and
an isolation circuit configured to isolate the receiver from the transmission signal and a noise signal generated by the transmitter, the noise signal having a frequency of the receive signal, the isolation circuit comprising a plurality of variable impedance devices configured to direct the transmission signal and the noise signal away from the receiver when the plurality of variable impedance devices are in a balanced state.

19. The electronic device of claim 18, wherein the plurality of variable impedance devices includes a first variable impedance device communicatively coupled to the antenna and the transmitter and having a first variable impedance, a second variable impedance device communicatively coupled to the receiver and having a second variable impedance, and a third variable impedance device communicatively coupled to the transmitter and the receiver and having a third variable impedance.

20. The electronic device of claim 19, comprising an antenna having a first impedance, wherein the plurality of variable impedance devices are in the balanced state when a ratio of the first variable impedance to the first impedance is equal to a ratio of the third variable impedance to the second variable impedance.

* * * * *

UNITED STATES PATENT AND TRADEMARK OFFICE
CERTIFICATE OF CORRECTION

PATENT NO. : 11,309,860 B1
APPLICATION NO. : 17/067017
DATED : April 19, 2022
INVENTOR(S) : Oliver Georg Dorn, Joonhoi Hur and Rastislav Vazny It is certified that error appears in the above-identified patent and that said Letters Patent is hereby corrected as shown below:

In the Specification

Column 14, Line 20, please delete the second occurrence of "the impedance of".

In the Claims

Column 18, Claim 19, Line 42, replace the word "the" with --an--.

Column 18, Claim 20, Line 49, replace the word "an" with --the--.

Signed and Sealed this
Twenty-fifth Day of October, 2022

*Katherine Kelly Vidal*
Katherine Kelly Vidal
*Director of the United States Patent and Trademark Office*